United States Patent
Iwai et al.

[11] Patent Number: 6,133,594
[45] Date of Patent: Oct. 17, 2000

[54] COMPOUND SEMICONDUCTOR DEVICE

[75] Inventors: Taisuke Iwai, Kanagawa; Shuichi Tanaka, Chiba, both of Japan

[73] Assignee: Fujitsu Limited, Kawasaki, Japan

[21] Appl. No.: 09/128,532

[22] Filed: Aug. 4, 1998

[30] Foreign Application Priority Data

Feb. 27, 1998 [JP] Japan ................. 10-048196

[51] Int. Cl.⁷ ............................. H01L 29/737
[52] U.S. Cl. ................ 257/198; 257/582; 257/197; 257/559; 257/586
[58] Field of Search .................. 257/197, 198, 257/586, 559, 582

[56] References Cited

U.S. PATENT DOCUMENTS 4,227,203  10/1980  Mikoshiba .............. 257/576
5,098,853   3/1992  Clark .................. 257/198

FOREIGN PATENT DOCUMENTS 63-69269  3/1988  Japan .................. 257/198
63-94678  4/1988  Japan .................. 257/198

OTHER PUBLICATIONS

IBM TDB vol. 31 No. 5 pp. 1–3 "Integrated Schottky Diodes in HBT Technology" Oct. 1988.

Primary Examiner—Jerome Jackson, Jr.
Attorney, Agent, or Firm—Armstrong, Westerman, Hattori, McLelland & Naughton

[57] ABSTRACT

A compound semiconductor device having a mesa type heterojunction bipolar transistor comprises a collector layer of first conductivity type having a collector breakdown voltage of a predetermined magnitude, a base layer of second conductivity type formed on the collector layer, an emitter layer of first conductivity type formed on the base layer, and a subcollector layer of first conductivity formed in a region remote laterally from an edge of the base layer to be connected to the collector layer.

11 Claims, 5 Drawing Sheets

COMPOUND SEMICONDUCTOR DEVICE

BACKGROUND OF THE INVENTION

1. Field of the Invention

The present invention relates to a compound semiconductor device and, more particularly, a compound semiconductor device having a mesa type bipolar transistor.

2. Description of the Prior Art

A heterojunction bipolar transistor (HBT) can be used as a high performance compound semiconductor due to its advantages of having a single power supply, a high output, and a high linearity thus, using it as a supply in a power amplifier of a mobile telephone terminal can now be expected. In addition, the HBT is used as an output device in a radio transmitting base station in which a high output, a high linearity, and a high breakdown voltage are needed.

Next, a configuration of a vertical type heterojunction bipolar transistor in the prior art will be explained with reference to FIG. 1.

In the HBT shown in FIG. 1, a buffer layer 102 made of i-AlGaAs, a subcollector layer 103 made of $n^+$-GaAs, a collector layer 104 made of $n^-$-GaAs, a base layer 105 made of $p^+$-GaAs, and an emitter layer 106 made of n-AlGaAs are stacked in sequence on a GaAs substrate 101.

The emitter layer 106, the base layer 105, and the collector layer 104 are patterned in sequence, so that a portion of the subcollector layer 103 to which a collector electrode 107 is connected is exposed. Also, the emitter layer 106 is patterned, so that a portion of the base layer 105 to which a base electrode 108 is connected is exposed. In addition, an emitter electrode 109 is connected to the emitter layer 106.

In such HBT, in order to enhance a base-collector breakdown voltage and enhance an emitter-collector breakdown voltage on condition the base is open, a carrier density in the collector layer 104 is reduced and a film thickness of the collector layer 104 is made thick. For instance, a device in which a film thickness of the collector layer 104 is set to 2 mm or more to attain a sufficient collector breakdown voltage has been fabricated.

Such the collector layer 104 is grown by the metal organic chemical vapor deposition (MOCVD) method, the molecular beam epitaxy (MBE) method, etc. In this case, normally a growth rate is set to 0.1 to 2.0 mm/hour, so that several hours is taken to grow the collector layer 104 of 1 to 2 mm thickness. As a result, productivity has been low in the existing circumstances.

Also, in the above configuration, since a part of the emitter layer 106 to the collector layer 104 is patterned continuously by etching, a difference in level, i.e., a step existing on the subcollector layer 103 is indispensably enlarged according as the thickness of the collector layer 104 increases. If such difference in level is increased, the emitter electrode 109 extending from the emitter layer 106 is ready to be disconnected due to the step, so that the yield of the bipolar transistor is lowered.

Furthermore, in the present condition, an impurity concentration in the collector layer 104 is set low of $2 \times 10^{16}$ to $5 \times 10^{16}$ atoms/cm$^3$ to enhance. However, the lower limit of the impurity concentration has been about $1 \times 10^{16}$ atoms/cm$^3$ if the impurity should be contained in the n type GaAs layer, and therefore a reproducibility of fabrication has been lost if the impurity concentration is set lower than such concentration to a enhancement of the breakdown voltage.

SUMMARY OF THE INVENTION

It is an object of the present invention to provide a compound semiconductor device having an HBT which is able to enhance a collector breakdown voltage and prevent the disconnection of wirings to thus improve the yield of fabrication.

According to the present invention, in such a transistor that has a configuration in which the emitter layer, the base layer, and the collector layer are stacked above a compound semiconductor substrate, the subcollector layer is connected to the collector layer on the side (in the lateral direction) of the base layer not to be positioned below the base layer and the emitter layer.

Accordingly, a substantial distance from the collector layer to the subcollector layer resides along the lateral direction of the collector layer. In other words, the film thickness of the conventional collector layer is equivalent to a distance from the subcollector layer to the edge portion of the base layer of the present invention.

In the case that the method by which the subcollector layer of the present invention is formed by ion-implanting the impurity into the collector layer is employed, the collector breakdown voltage can be adjusted by varying positions of ion implantation and also such adjustment can be performed easily. In addition, because such a necessity that the collector layer must be etched to expose the subcollector layer is eliminated, the difference in level on the substrate is reduced.

Also, in case such a configuration wherein the subcollector layer must be grown beneath the collector layer is employed, a movement of the carrier along the film thickness direction of the subcollector layer can be suppressed by removing a part of the subcollectot layer positioned below the emitter layer.

The stacking order of the emitter layer, the base layer, and the collector layer is not particularly limited, and thus the collector layer may be stacked as the uppermost layer.

DESCRIPTION OF THE PREFERRED EMBODIMENTS

Therefore, embodiments of the present invention will be explained with reference to the accompanying drawings hereinafter.

FIRST EMBODIMENT

Figure 2A:
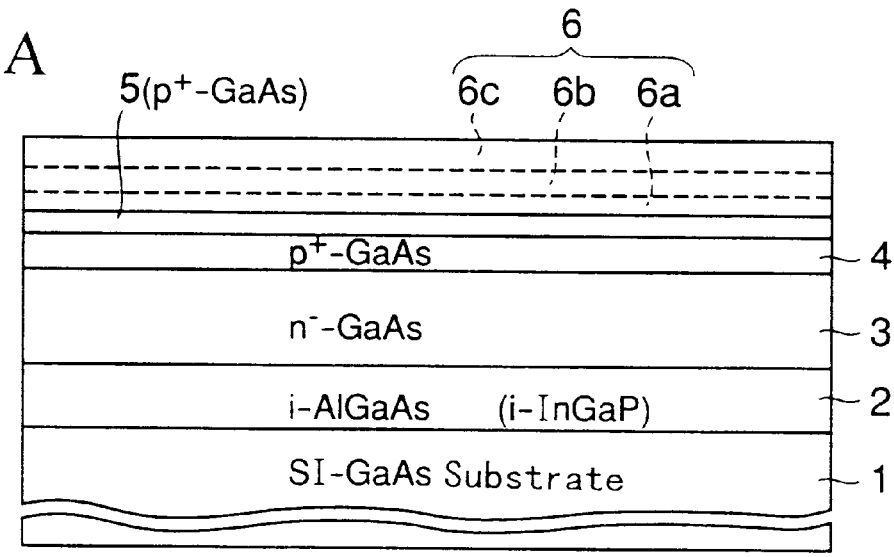
FIGS. 2A to 2C are sectional views showing steps of manufacturing an HBT according to a first embodiment of the present invention.
Figure 2B:
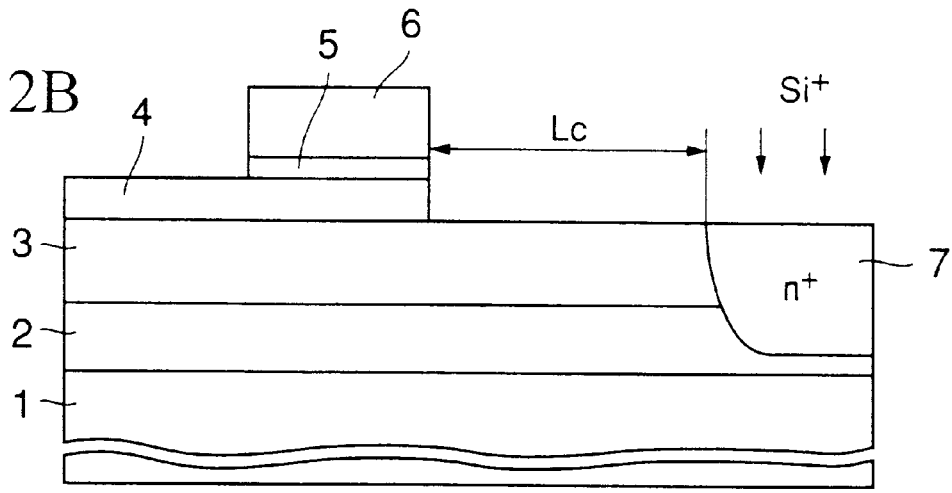
Figure 2C:
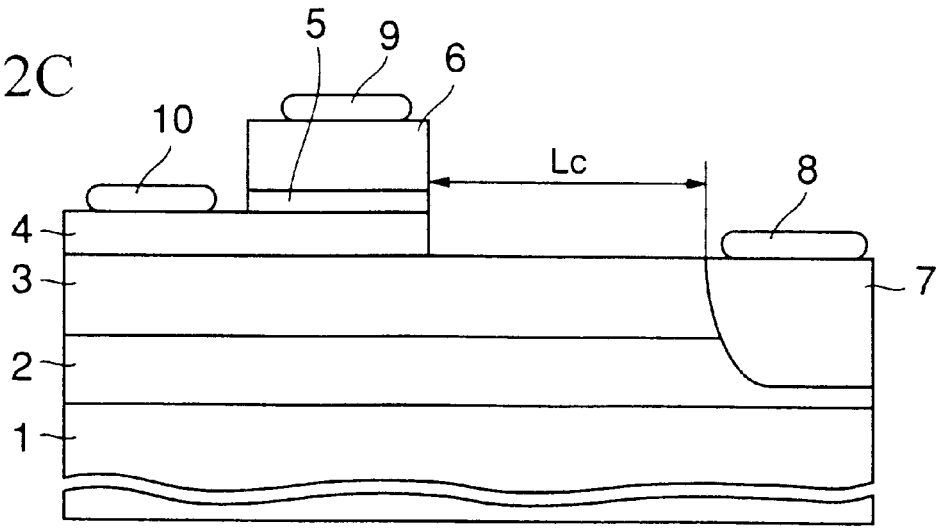

FIGS. 2A to 2C are sectional views showing steps of manufacturing an HBT device according to a first embodiment of the present invention.

First, as shown in FIG. 2A, a buffer layer 2 made of undoped AlGaAs or InGaP, a collector layer 3 made of n⁺-GaAs, a base layer 4 made of p⁺-GaAs, an emitter layer 5 made of n-AlGaAs or InGaP, and an emitter cap layer 6 containing GaAs are epitaxial-grown in sequence on a GaAs semi-insulating substrate 1 by the MOCVD method or the MBE method to have a thickness of 100 nm, 600 nm, 70 nm, 30 nm, 400 nm respectively. The emitter cap layer 6 has a three-layered configuration, i.e., an n-GaAs layer 6a of 120 nm thickness, an n⁺-GaAs layer 6b of 180 nm thickness, and an n+-InGaAs layer 6c of 100 nm thickness, which are formed on the emitter layer 5 in sequence.

By way of example, silicon may be employed as the n type impurity of these compound semiconductor and zinc may be employed as the p-type impurity thereof. Further, the impurity concentration of the collector layer 3 is $3 \times 10^{16}$ atoms/cm³, the impurity concentration of the base layer 4 is $4 \times 10^{19}$ atoms/cm³, and the impurity concentration of the emitter layer 5 is $3 \times 10^{17}$ atoms/cm³. Also, in the emitter cap layer 6, the impurity concentration of the n-GaAs layer 6a is $3 \times 10^{17}$ atoms/cm³, the impurity concentration of the n⁺-GaAs layer 6b is $3 \times 10^{18}$ atoms/cm³, and the impurity concentration of the n+InGaAs layer 6c is $3 \times 10^{19}$ atoms/cm³.

Next, as shown in FIG. 2B, after the emitter cap layer 6, the emitter layer 5, and the base layer 4 are patterned by virtue of the photolithography to have the same planar shape, the emitter cap layer 6 and the emitter layer 5 are then patterned by virtue of the photolithography to expose a part of the base layer 4.

Subsequently the n type impurity (e.g., silicon) ion is implanted in a region remote from a side edge of the base layer 4 by a distance Lc to a depth extending from the collector layer 3 to an upper layer portion of the buffer layer 2 so as not to activate such region, so that a subcollector region 7 is formed in the reigon. Impurity ion implantation is carried out at such a dosage that the impurity concentration of the subcollector region 7 is set to about $5 \times 10^{18}$ atoms/cm³.

Thereafter, as shown in FIG. 2C, a collector electrode 8 is formed on the subcollector region 7, also an emitter electrode 9 is formed on the emitter cap layer 6, and also a base electrode 10 is formed on the base layer 4. These electrodes 8 to 10 are formed by a multi-layered film which is formed by laminating titanium, platinum, and gold in sequence from the bottom, and they are patterned by the lift-off method using the resist pattern and the sputter film forming.

In the above HBT, electrons which are accelerated vertically by the base-collector voltage are injected from the base layer 4 into the collector layer 3. Because the subcollector layer is not formed directly below the emitter layer 5 and the base layer 4 and an electric field is also generated in the collector layer 3 in the lateral direction, the electrons injected into the collector layer 3 are accelerated in the lateral direction to travel in the collector layer 3 and then absorbed by the collector electrode 8 through the subcollector region 7 finally.

Figure 1:
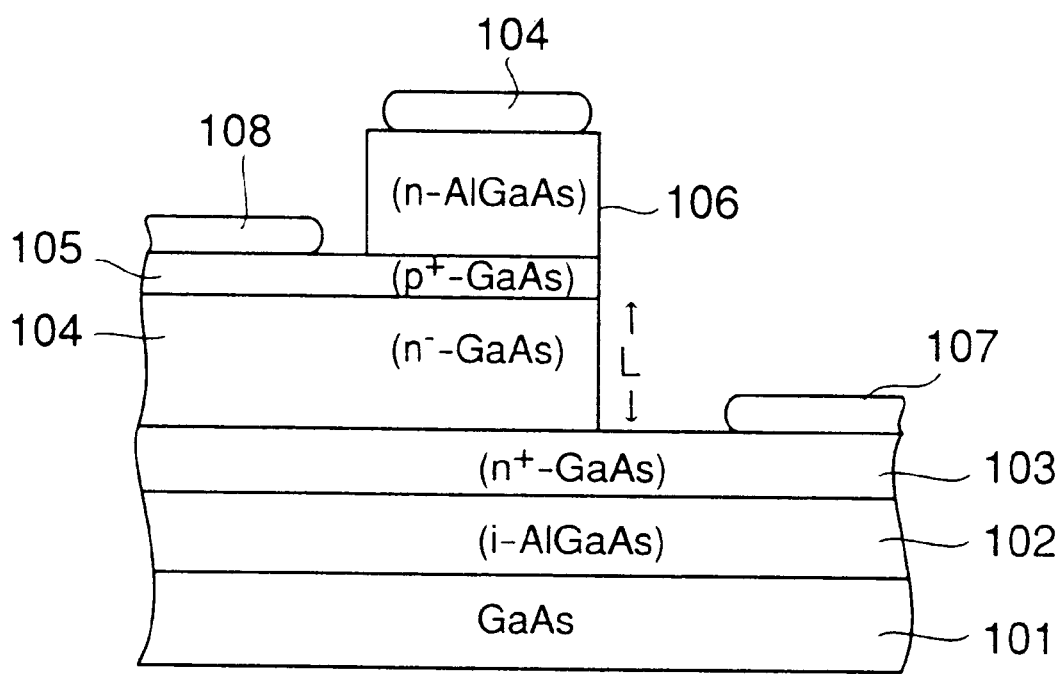
FIG. 1 is a sectional view showing a configuration of an HBT in the prior art.

It is to be noted that, since the lateral distance Lc in the collector layer 3 is substantially equal to the film thickness of the conventional collector layer 104 shown in FIG. 1, such distance Lc acts as the factor to determine the breakdown voltage.

Figure 3:
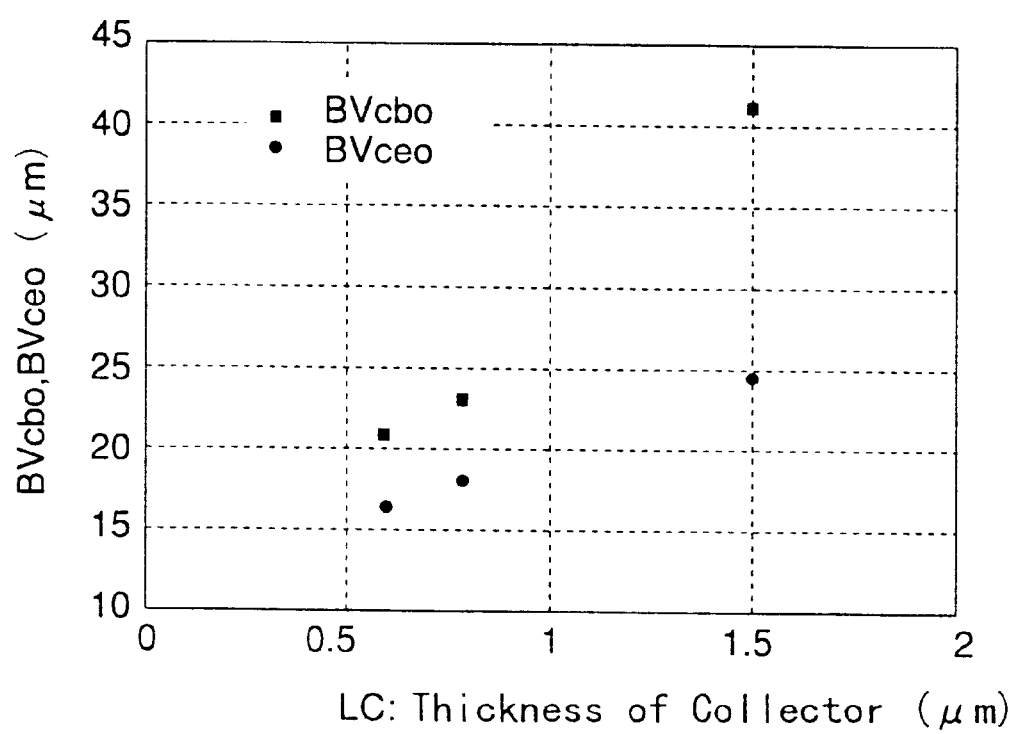
FIG. 3 is a characteristic view showing change in a collector breakdown voltage relative to a distance between a subcollector layer and a base layer of the HBT shown in FIG. 2C.

As with the heterojunction bipolar transistor constructed to have the above configuration, when the base-collector breakdown voltage ($BV_{cbo}$) and the emitter-collector breakdown voltage ($BV_{ceo}$) have been measured by varying the distance Lc between the collector layer 3 and the subcollector region 7, the results shown in FIG. 3 have been derived. According to FIG. 3, it has been found that both the base-collector breakdown voltage and the emitter-collector breakdown voltage are increased as the distance Lc is increased longer.

The impurity concentration of the subcollector region 7 has been set to $5 \times 10^{18}$ atoms/cm³.

At any rate, it has been known that, in the conventional bipolar transistor shown in FIG. 1, the collector breakdown voltage is increased with the increase of the film thickness of the collector layer.

From the above facts, it is deduced that the lateral distance Lc expanding from the side edge of the base layer 4 to the subcollector region 7 is substantially equivalent to the film thickness L of the conventional collector layer 104 shown in FIG. 1 and thus the breakdown voltages $BV_{cbo}$, $BV_{ceo}$ can be determined according to a dimension of the distance Lc.

The distance Lc can be changed easily regardless of the epitaxial growth time, and the range of change of the distance Lc corresponds to the dimension of the substrate at its maximum. And, such change of the distance Lc can be done by changing the position to which the impurity ion is implanted.

Accordingly, the heterojuncion bipolar transistor having the high collector breakdown voltage which has not been obtained in the past can be fabricated and also the collector breakdown voltage which adjust to the transistor characteristics can be arbitrarily without the increase in manufacturing time. For example, if a plurality of bipolar transistors are formed on one substrate, the distance Lc of the bipolar transistor to improve a high frequency characteristic can be shortened while the distance Lc of the bipolar transistor to enhance the breakdown voltage can be lengthened. In this manner, such transistor is very advantageous to the case where multi kinds of discrete semiconductor devices are to be formed on one substrate or a plurality of semiconductor devices are to be integrated.

In the bipolar transistor having the configuration shown in FIG. 2C, since the subcollector layer 7 is not formed by the epitaxial growth, the difference in level formed above the GaAs substrate 1 is about the total film thickness of the emitter cap layer 6, the emitter layer 5, and the base layer 4 at most and is reduced smaller than that created in the conventional configuration as shown in FIG. 1. As a result, if the emitter electrode 9 is extended to the outside of the emitter layer 6, the disconnection of the emitter electrode 9 due to the step is prevented.

Furthermore, since the step of etching the collector layer 3 is omitted, the epitaxial growth time is reduced.

The distance Lc can be selected according to the trade-off between the breakdown voltage and the transistor characteristics. It is preferable that the distance Lc should be set in the range of 0.1 to 10 μm.

As the method of forming the subcollector layer 7, in addition to the method of forming it by virtue of the impurity ion implantation, there are the method of thermally diffusing the impurity, the method of forming it by alloying the gold-germanium (AuGe) alloy with the collector layer 8, or the like.

SECOND EMBODIMENT

Figure 4:
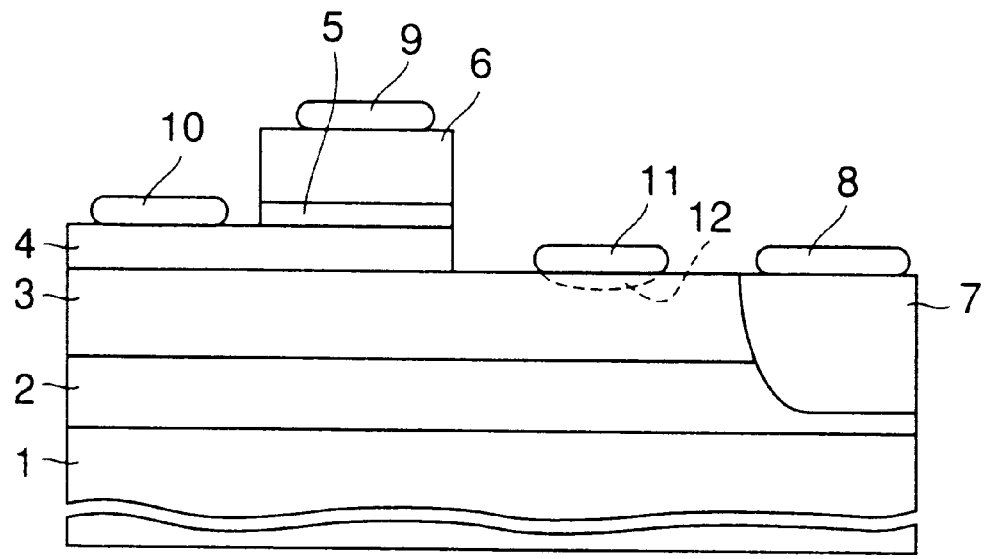
FIG. 4 is a sectional view showing a first example of the HBT according to a second embodiment of the present invention.

FIG. 4 shows a heterojunction bipolar transistor according to a second embodiment of the present invention and a basic configuration is identical to that shown in FIGS. 2A to 2C.

In FIG. 4, the same references as those in FIG. 2C denote the same elements.

In FIG. 4, a Schottky barrier metal electrode 11 made of tungsten silicide (WSi) is connected to a region between the subcollector region 7 and the base layer 4 out of an upper surface of the collector layer 3 of the heterojunction bipolar transistor. A Schottky barrier exists between the collector layer 3 and the Schottky barrier metal electrode 11. A depletion layer 12 is formed in the collector layer 3 from a bottom of the Schottky barrier metal electrode 11. A carrier passing region in the collector layer 3 becomes narrower as the depletion layer 12 is spread wider.

By way of example, if the surface state, the surface depletion which exist on a surface of the collector layer 3 causes reduction in the collector current, the collector current can be increased by applying the positive bias voltage to the Schottky barrier metal electrode 11 to thus achieve high performance of the transistor.

Also, in the event that the backward bias voltage is applied between the Schottky barrier metal electrode 11 and the collector layer 3, the magnitude of the collector current can be controlled by adjusting the backward bias voltage to spread the depletion layer 12.

Figure 5:
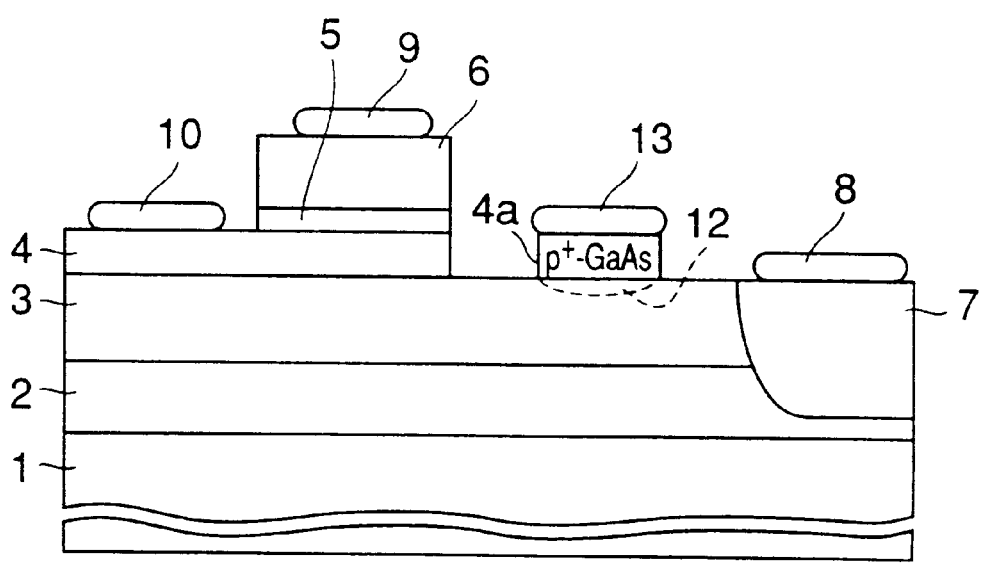
FIG. 5 is a sectional view showing a second example of the HBT according to a second embodiment of the present invention.

At any rate, as shown in FIG. 5, a p$^+$-GaAs layer 4a may be formed instead of the Schottky barrier metal electrode 11 and then an ohmic electrode 13 made of the same metal as the collector electrode 8 may be formed on the p$^+$-GaAs layer 4a.

In this case, a pn-junction is formed between the p$^+$-GaAs layer 4a and the n-collector layer 3 and then the spread of the depletion layer 12 generated from the pn-junction can be controlled by adjusting the voltage value applied to the ohmic electrode 13. Since the p$^+$-GaAs layer 4a can be formed readily by leaving the GaAs layer constituting the base layer 4 on the collector layer 3, the manufacturing steps are never increased rather than the case where the device having the configuration shown in FIG. 4 is fabricated.

THIRD EMBODIMENT

Figure 6A:
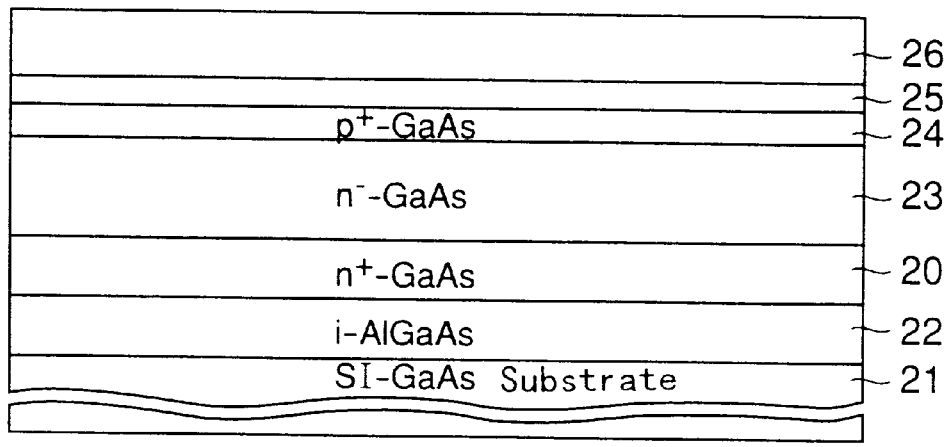
FIGS. 6A to 6C are sectional views showing steps of manufacturing the HBT according to a third embodiment of the present invention.
Figure 6B:
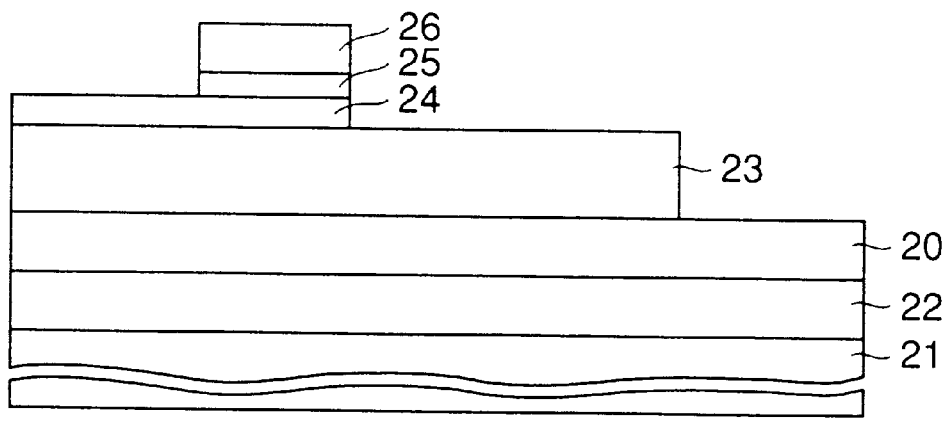
Figure 6C:
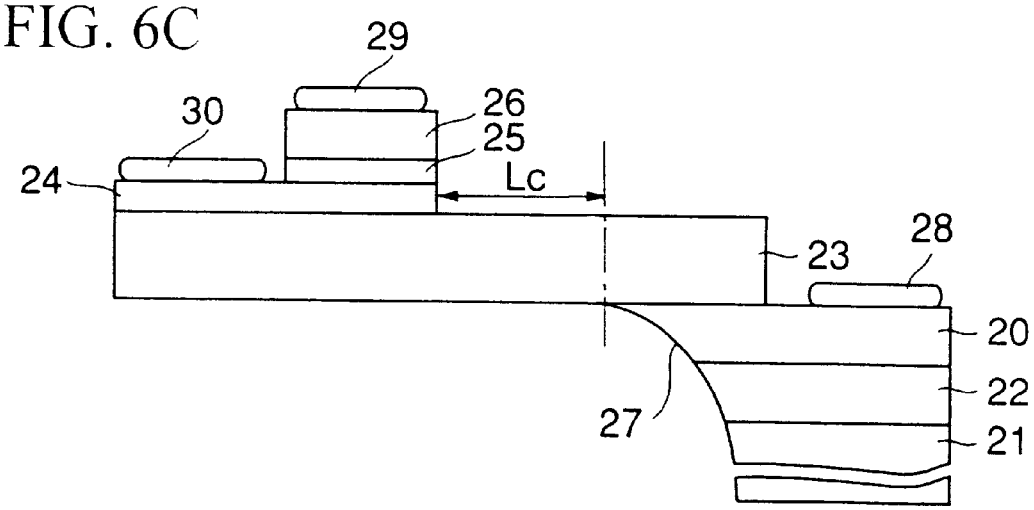

FIGS. 6A to 6C show a device in which, unlike the first and second embodiments, the subcollector layer is formed by epitaxial growth.

First, a buffer layer 22 made of undoped AlGaAs, a subcollector layer 20 made of n$^+$-GaAs, a collector layer 23 made of n$^-$-GaAs, a base layer 24 made of p$^+$-GaAs, an emitter layer 25 made of n-AlGaAs, and an emitter cap layer 26 containing GaAs are grown respectively on a semi-insulating GaAs substrate 21 by the MOCVD method or the MBE method. The film thicknesses and the impurity concentrations of these compound semiconductor layers are selected similarly to those of the compound semiconductor layers having the same function in the first embodiment.

The impurity concentration of the subcollector layer 20 is $5 \times 10^{18}$ atoms/cm$^3$ and the film thickness of the subcollector layer 20 is 600 nm.

Next, as shown in FIG. 6B, the emitter cap layer 26, the emitter layer 25, and the base layer 24 are patterned by using the photolithography so as to have the same planar shape, and then the emitter cap layer 26, and the emitter layer 25 are patterned by using the photolithography so as to expose a part of the base layer 24.

In turn, the collector layer 23 is patterned to expose the subcollector layer 20 in the region which is remote from the base layer 24 longer than the distance Lc.

Then, as shown in FIG. 6C, a part of the subcollector layer 20, the buffer layer 22, and the GaAs substrate 21 is etched, so that an opening 27 to expose a part of a bottom surface of the collector layer 23 is formed. A shortest distance from an upper end of a side wall of the subcollector layer 20 exposed from the opening 27 to an edge of the base layer 24 is set to Lc.

Then, a collector electrode 28 is formed on an exposed surface of the subcollector layer 20 which is located on a region of the subcollector layer 20 away the distance Lc from the edge of the base layer 24.

An emitter electrode 29 is formed on the emitter cap layer 26, and a base electrode 30 is formed on the base layer 24. These electrodes 28 to 30 have the same configurations as the electrodes 8 to 10 shown in the first embodiment.

In the bipolar transistor having such configuration, since the subcollector layer 20 is not formed beneath the base layer 24, the electrons which pass through the emitter layer 25 and the base layer 24 formed below the emitter layer 25 can spread in the collector layer 23 laterally and then reach the subcollector 20 located at the distance Lc. As a result, the electrons can come to the collector electrode 28 connected to the subcollector layer 20.

Accordingly, in this bipolar transistor, as with the case in the first embodiment, the carrier passing route in the collector layer 23 becomes substantially lateral and can be determined by the distance Lc, so that such distance Lc can serve as one factor to determine the base-collector breakdown voltage and the emitter-collector breakdown voltage. In such configuration, since the emitter layer 25 and the collector layer 23 do not have the same pattern, the difference in level between the compound semiconductor layers is in no way increased.

In such configuration, the structure in which the Schottky electrode 11 or the p$^+$-GaAs layer 4a, as shown in FIG. 4 and FIG. 5, are formed may be employed.

As described above, according to the present invention, in the transistor having the configuration in which the emitter layer, the base layer, and the collector layer are laminated, the subcollector layer is not placed below the base layer and the emitter layer but connected to the collector layer on the side (in the lateral direction) of the base layer. For this reason, the film thickness of the conventional collector layer is equivalent to the distance from the edge portion of the base layer to the subcollector layer in the lateral direction, and therefore an adjustment of the collector breakdown voltage can be facilitated by adjusting the connection position of the collector layer and the subcollector layer.

Moreover, since there is no necessity of etching the collector layer to expose the subcollector layer, the difference in level on the substrate can be reduced.

What is claimed is:

1. A compound semiconductor device having a heterojunction bipolar transistor, comprising:

a compound semiconductor substrate;

a collector layer of first conductivity type formed on or above a part of the compound semiconductor substrate;

a base layer of second conductivity type formed on the collector layer, the base layer formed narrower than the collector layer;

an emitter layer of first conductivity type formed on the base layer; and a subcollector layer of first conductivity type formed, in contact with the collector layer except under the base layer, at a predetermined lateral distance from a side edge of the base layer.

2. The compound semiconductor device according to claim 1, wherein the subcollector layer is a region having higher impurity concentration than that of the collector layer.

3. The compound semiconductor device according to claim 1, wherein the subcollector layer is a region which is formed by introducing impurity into the collector layer from an outside.

4. The compound semiconductor device according to claim 1, wherein the subcollector layer is formed beneath the collector layer and has an opening below the base layer.

5. The compound semiconductor device according to claim 1, wherein a breakdown voltage between the base layer and the collector layer is determined using a lateral distance between the subcollector layer and the base layer as one of parameters.

6. The compound semiconductor device according to claim 1, wherein a breakdown voltage between the emitter layer and the collector layer is determined using a lateral distance between the subcollector layer and the base layer as one of parameters.

7. The compound semiconductor device according to claim 1, wherein a Schottky electrode which has a Schottky barrier on a surface of the collector layer and is formed on the surface of the collector layer in a region between the subcollector layer and the base layer.

8. The compound semiconductor device according to claim 1, further comprising:

a compound semiconductor layer of second conductivity type formed on the collector layer in a region between the subcollector layer and the base layer; and an electrode formed on the compound semiconductor layer to be brought into ohmic-contact with the compound semiconductor layer.

9. The compound semiconductor device according to claim 1, wherein the emitter layer is formed of material which has an energy bandgap wider than the base layer.

10. The compound semiconductor device according to claim 1, wherein a buffer layer is formed between the compound semiconductor substrate and the collector layer.

11. The compound semiconductor device according to claim 1, further comprising:

a emitter electrode formed on the emitter layer;

a base electrode formed on the base layer; and a collector electrode formed on the collector layer.

* * * * *